United States Patent
Chen et al.

(10) Patent No.: US 12,080,563 B2
(45) Date of Patent: *Sep. 3, 2024

(54) SEMICONDUCTOR DEVICES AND METHODS OF MANUFACTURING

(71) Applicant: Taiwan Semiconductor Manufacturing Co., Ltd., Hsinchu (TW)

(72) Inventors: Chien-Hsun Chen, Zhutian Township (TW); Yu-Min Liang, Zhongli (TW); Yen-Ping Wang, Hemei Township (TW); Jiun Yi Wu, Zhongli (TW); Chen-Hua Yu, Hsinchu (TW); Kai-Chiang Wu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/994,841

(22) Filed: Nov. 28, 2022

(65) Prior Publication Data

US 2023/0091737 A1 Mar. 23, 2023

Related U.S. Application Data

(63) Continuation of application No. 16/869,066, filed on May 7, 2020, now Pat. No. 11,515,173.

(Continued)

(51) Int. Cl.
*H01L 21/48* (2006.01)
*H01L 21/56* (2006.01)
(Continued)

(52) U.S. Cl.
CPC ........... *H01L 21/486* (2013.01); *H01L 21/56* (2013.01); *H01L 21/76898* (2013.01);
(Continued)

(58) Field of Classification Search
CPC . H01L 21/486; H01L 21/56; H01L 21/76898; H01L 23/3121; H01L 23/481;
(Continued)

(56) References Cited

U.S. PATENT DOCUMENTS 9,000,584 B2 4/2015 Lin et al.
9,048,222 B2 6/2015 Hung et al.
(Continued)

FOREIGN PATENT DOCUMENTS

TW 200832673 A 8/2008
TW 201719857 A 6/2017
TW 201916191 A 4/2019

*Primary Examiner* — Herve-Louis Y Assouman
(74) *Attorney, Agent, or Firm* — Slater Matsil, LLP

(57) ABSTRACT

Interconnect devices, packaged semiconductor devices and methods are disclosed herein that are directed towards embedding a local silicon interconnect (LSI) device and through substrate vias (TSVs) into system on integrated substrate (SoIS) technology with a compact package structure. The LSI device may be embedded into SoIS technology with through substrate via integration to provide die-to-die FL connection arrangement for super large integrated Fan-Out (InFO) for SBT technology in a SoIS device. Furthermore, the TSV connection layer may be formed using lithographic or photoresist-defined vias to provide eLSI P/G out to a ball-grid-array (BGA) connection interface.

20 Claims, 12 Drawing Sheets

Related U.S. Application Data

(60) Provisional application No. 62/954,329, filed on Dec. 27, 2019.

(51) Int. Cl.
  *H01L 21/683* (2006.01)
  *H01L 21/768* (2006.01)
  *H01L 23/00* (2006.01)
  *H01L 23/31* (2006.01)
  *H01L 23/48* (2006.01)
  *H01L 23/498* (2006.01)
  *H01L 23/522* (2006.01)
  *H01L 23/538* (2006.01)

(52) U.S. Cl.
  CPC ........ *H01L 23/3121* (2013.01); *H01L 23/481* (2013.01); *H01L 23/5226* (2013.01)

(58) Field of Classification Search
  CPC ........... H01L 23/5226; H01L 23/49816; H01L 2224/18; H01L 2224/73204; H01L 23/145; H01L 23/49822; H01L 23/49827; H01L 23/49833; H01L 2221/68345; H01L 21/6835
  See application file for complete search history.

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,543,242 B1 | 1/2017 | Kelly et al. |
| 11,515,173 B2 * | 11/2022 | Chen ................ H01L 23/49833 |
| 2008/0155820 A1 | 7/2008 | Arai et al. |
| 2012/0061821 A1 | 3/2012 | Black et al. |
| 2015/0171024 A1 | 6/2015 | Choi et al. |
| 2016/0204093 A1 | 7/2016 | Lin et al. |
| 2017/0092617 A1 | 3/2017 | Wu et al. |
| 2017/0133351 A1 | 5/2017 | Su et al. |
| 2018/0040546 A1 | 2/2018 | Yu et al. |
| 2018/0102311 A1 | 4/2018 | Shih |
| 2018/0158771 A1 | 6/2018 | Akiba et al. |
| 2018/0240778 A1 | 8/2018 | Liu et al. |
| 2018/0240788 A1 | 8/2018 | Sobieski et al. |
| 2018/0294212 A1 | 10/2018 | Chen et al. |
| 2018/0350745 A1 | 12/2018 | Hsieh et al. |
| 2019/0088581 A1 | 3/2019 | Yu et al. |
| 2019/0157206 A1 | 5/2019 | Wang et al. |

* cited by examiner

SEMICONDUCTOR DEVICES AND METHODS OF MANUFACTURING

PRIORITY CLAIM AND CROSS-REFERENCE

This application is a continuation of U.S. patent application Ser. No. 16/869,066 filed on May 7, 2020, entitled "Semiconductor Devices and Methods of Manufacturing," which claims the benefit of U.S. Provisional Application No. 62/954,329, entitled "Semiconductor Devices and Methods of Manufacturing," filed on Dec. 27, 2019, which applications are hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area.

As the demand for miniaturization, higher speed and greater bandwidth, as well as lower power consumption and latency has grown recently, there has grown a need for smaller and more creative packaging techniques of semiconductor dies and wafer level system integration (WLSI) have emerged. An example of such packaging systems is system on integrated substrate (SoIS) technology. In a SoIS device, a top semiconductor package is stacked on top of an integrated substrate using redistribution layers to allow external connectivity to a high level of integration and component density within the SoIS device. SoIS technology generally enables production of semiconductor devices with enhanced functionalities, small footprints, and component reliability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
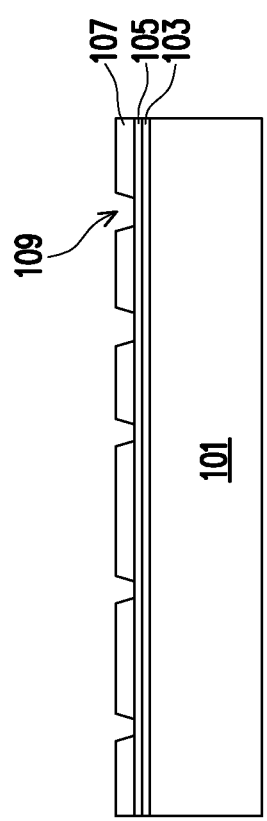
FIGS. 1 through 9 illustrate cross-sectional views of intermediate steps of forming a first interconnect structure, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this disclosure, various aspects of a package and the formation thereof are described. In some embodiments, interconnect devices incorporated within the package may electrically connect two or more semiconductor die. The interconnect device may have a high routing density and be located close to the semiconductor die, which can improve the bandwidth of communication between the semiconductor dies. The interconnect device provides for a high yield redistribution layer structure with die-to-die connections having fine pitch widths for mounted devices.

FIG. 1 illustrates a formation of a polymer layer 105 over a first carrier substrate 101 in an initial step in forming a first redistribution structure 120 in an intermediate step of forming the first interconnect structure 100, in accordance with some embodiments. In particular, FIG. 1 illustrates the first carrier substrate 101 with a release layer 103 and a polymer layer 105 over the first carrier substrate 101. The first carrier substrate 101 comprises, for example, silicon based materials, such as glass or silicon oxide, or other materials, such as aluminum oxide, combinations of any of these materials, or the like. The first carrier substrate 101 is planar in order to accommodate an attachment of semiconductor devices (e.g., passive devices, active devices, or the like), as discussed below.

The release layer 103 is placed on the first carrier substrate 101 in order to assist in the adherence of overlying structures (e.g., the polymer layer 105). In an embodiment the release layer 103 may comprise a light to heat conversion (LTHC) coating. However, other types of adhesives, such as ultra-violet glue, which loses its adhesive properties when exposed to ultra-violet light, pressure sensitive adhesives, radiation curable adhesives, epoxies, combinations of these, or the like, may also be used. The release layer 103 may be placed onto the first carrier substrate 101 in a semi-liquid or gel form, which is readily deformable under pressure.

The polymer layer 105 is placed over the release layer 103 and is utilized in order to protect, for example, the attached semiconductor devices (e.g., passive devices, active devices, or the like) once the devices have been attached. In an embodiment the polymer layer 105 may be polybenzoxazole (PBO), although any suitable material, such as polyimide or a polyimide derivative may also be utilized. The polymer layer 105 may be placed using, e.g., a spin-coating process to a thickness of between about 0.5 μm and about 10 μm, such as about 5 μm, although any suitable method and thickness may also be used.

Once the polymer layer 105 has been formed, a first dielectric layer 107 of the first redistribution structure 120 is formed over the polymer layer 105, and the first dielectric layer 107 may be a material such as polybenzoxazole (PBO), although any suitable material, such as polyimide or a polyimide derivative may be utilized. The first dielectric layer 107 may be placed using, e.g., a spin-coating process, although any suitable method may be used.

After the first dielectric layer 107 has been formed, openings 109 may be made through the first dielectric layer 107 by removing portions of the first dielectric layer 107. The openings 109 may be formed using a suitable photolithographic mask and etching process, although any suitable process or processes may be used to pattern the first dielectric layer 107.

Figure 2:
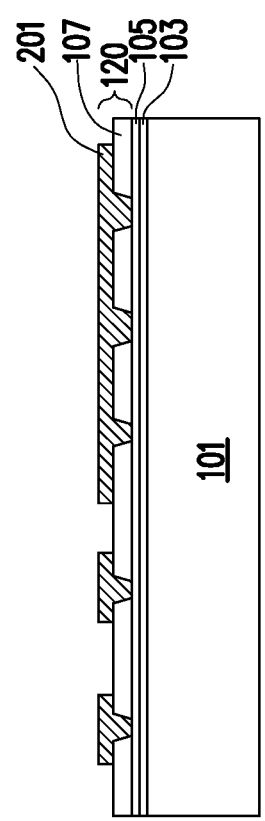

FIG. 2 illustrates a formation of a first conductive layer 201 of the first redistribution structure 120, in accordance with some embodiments. In particular, FIG. 2 illustrates the first conductive layer 201 is formed over and through the openings 109 formed within the first dielectric layer 107. The first conductive layer 201 may be formed by initially depositing a seed layer (not shown) of a titanium copper alloy through a suitable formation process such as chemical vapor deposition (CVD) or sputtering. A photoresist (also not shown) may then be formed to cover the first seed layer, and the photoresist may then be patterned to expose those portions of the first seed layer that are located where the first conductive layer 201 is desired to be located.

Once the photoresist has been formed and patterned, a conductive material, such as copper, may be formed on the first seed layer through a deposition process such as plating. The conductive material may be formed to have a thickness of between about 1 μm and about 10 μm, such as about 5 μm. However, while the material and methods discussed are suitable to form the conductive material, these materials are merely examples that may be used in some embodiments. Any other suitable materials, such as AlCu or Au, and any other suitable processes of formation, such as CVD or physical vapor deposition (PVD), may be used to form the first conductive layer of the first conductive layer 201. Once the conductive material has been formed, the photoresist may be removed through a suitable removal process such as ashing. Additionally, after the removal of the photoresist, those portions of the first seed layer that were covered by the photoresist may be removed through, for example, a suitable etch process using the first conductive layer 201 as a mask. The first dielectric layer 107 and the first conductive layer 201 may be collectively referred to herein as a metallization layer of the first redistribution structure 120.

Once the first conductive layer 201 has been formed, other optional metallization layers of the first redistribution structure 120 may be formed overlying one another by repeating steps similar to those for forming the first dielectric layer 107 and the first conductive layer 201. These steps may be repeated as desired in order to electrically connect each overlying metallization layer to an underlying metallization layer of the first redistribution structure 120, and may be repeated as often as desired until an uppermost metallization layer of the first redistribution structure 120 has been formed. In some embodiments, the first dielectric layer 107 and the first conductive layer 201 serve as the uppermost metallization layer of the first redistribution structure 120. In another embodiment, the first redistribution structure 120 may comprise two metallization layers, although any suitable number of individual metallization layers may be utilized. Furthermore, the first redistribution structure 120 may also be referred to herein as a back-side metallization layer of the first interconnect structure 100.

Figure 3:
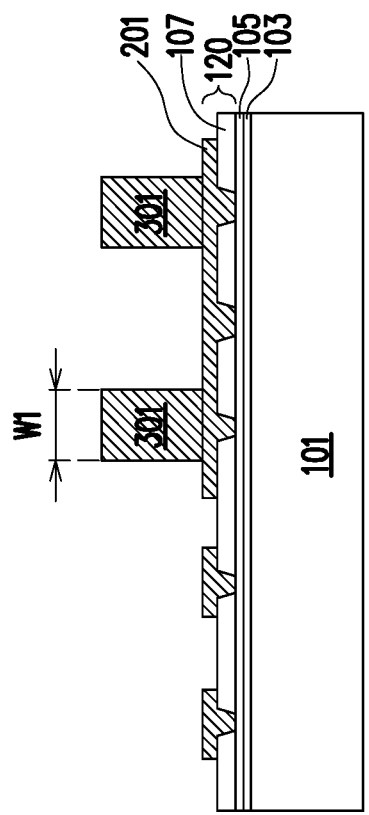

FIG. 3 illustrates the formation of first through molding vias 301 over the first redistribution structure 120 in an initial step in forming a local interconnect layer 520, according to some embodiments. Once the first redistribution structure 120 has been formed over the first carrier substrate 101, first through molding vias 301 are formed in electrical connection with the first redistribution structure 120. In an embodiment the first through molding vias 301 may be formed by initially forming a second seed layer (not separately illustrated in FIG. 3) over the uppermost metallization layer of the first redistribution structure 120. In an embodiment the second seed layer is a thin layer of a conductive material that aids in the formation of a thicker layer during subsequent processing steps. The second seed layer may comprise a layer of titanium about 1,000 Å thick followed by a layer of copper about 5,000 Å thick. The second seed layer may be created using processes such as sputtering, evaporation, or plasma enhanced chemical vapor deposition (PECVD) processes, depending upon the desired materials. The second seed layer may be formed to have a thickness of between about 0.3 μm and about 1 μm, such as about 0.5 μm.

Once the second seed layer has been formed, a photoresist (also not illustrated) is placed over the second seed layer. In an embodiment the photoresist may be placed on the second seed layer using, e.g., a spin coating technique to a height of between about 50 μm and about 250 μm, such as about 120 μm. Once in place, the photoresist may then be patterned by exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern. In an embodiment the pattern formed into the photoresist is a pattern that may be used to form the first through molding vias 301 in such a placement as to be located on different sides of subsequently attached local interconnect device 401 as is discussed in more detail below. However, any suitable arrangement for the pattern of the first through molding vias 301 may be utilized.

In an embodiment the first through molding vias 301 are formed within the photoresist from one or more conductive materials, such as copper, tungsten, other conductive metals, or the like, and may be formed, for example, by electroplating, electroless plating, or the like. For example, an electroplating process is used wherein the second seed layer and the photoresist are submerged or immersed in an electroplating solution. The second seed layer surface is electrically connected to the negative side of an external DC power supply such that the second seed layer functions as the cathode in the electroplating process. A solid conductive anode, such as a copper anode, is also immersed in the solution and is attached to the positive side of the power supply. The atoms from the anode are dissolved into the solution, from which the cathode, e.g., the second seed layer, acquires the dissolved atoms, thereby plating the exposed conductive areas of the second seed layer within the opening of the photoresist.

Once the first through molding vias 301 have been formed using the photoresist and the second seed layer, the photoresist may be removed using a suitable removal process. In an embodiment, a plasma ashing process may be used to remove the photoresist, whereby the temperature of the photoresist may be increased until the photoresist experiences a thermal decomposition and may be removed. However, any other suitable process, such as a wet strip, may be utilized. The removal of the photoresist may expose the underlying portions of the second seed layer.

Once exposed a removal of the exposed portions of the second seed layer may be performed. In an embodiment the exposed portions of the second seed layer (e.g., those portions that are not covered by the first through molding vias 301) may be removed by, for example, a wet or dry etching process. For example, in a dry etching process reactants may be directed towards the second seed layer using the first through molding vias 301 as masks. In another embodiment, etchants may be sprayed or otherwise put into contact with the second seed layer in order to remove the exposed portions of the second seed layer. After the exposed portion of the second seed layer has been etched away, a portion of the first redistribution structure 120 is exposed between the first through molding vias 301. According to some embodiments, the first through molding vias 301 may be formed to a first width W1 of between about 10 μm and about 100 μm, such as about 50 μm. However, any suitable width may be used.

Figure 4:
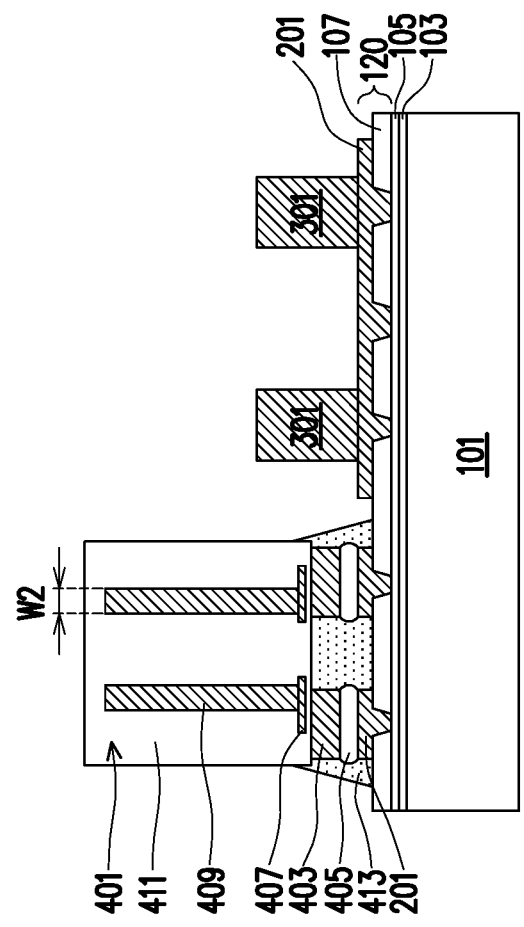

Turning to FIG. 4, local interconnect device 401 is attached to the first redistribution structure 120, in accordance with some embodiments. In some embodiments, the local interconnect device 401 comprises conductive connectors 403, which may be used to make electrical connections to the local interconnect device 401. The local interconnect device 401 shown in FIG. 4 has conductive connectors 403 formed on a single side of the local interconnect device 401, but in some embodiments, a local interconnect device 401 may have conductive connectors 403 formed on both sides. In some embodiments, a solder material 405 is formed on each conductive connector 403 prior to attachment. FIG. 4 shows one local interconnect device 401 attached to the first carrier substrate 101, but in other embodiments, two or more local interconnect devices 401 may be attached. According to some embodiments, multiple devices similar to the local interconnect device 401 and/or more than one different type of local interconnect device 401 may be attached. In some embodiments, other types of devices may be attached to the first carrier substrate 101 in addition to local interconnect device 401, such as electronic devices 410 described below.

In some embodiments, the conductive connectors 403 comprise metal pads or metal pillars (such as copper pillars). The conductive connectors 403 may include a conductive material such as solder, copper, aluminum, gold, nickel, silver, palladium, tin, the like, or a combination thereof. In some embodiments, the metal pillars may be solder-free and/or have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. In some embodiments, the pitch of the conductive connectors 403 may be between about 20 μm and about 80 μm, and the height of the conductive connectors 403 may be between about 2 μm and about 30 μm.

In some embodiments, the solder material 405 formed on the conductive connectors 403 may be ball grid array (BGA) connectors, solder balls, controlled collapse chip connection (C4) bumps, micro bumps (e.g., μbumps), electroless nickel-electroless palladium-immersion gold technique (ENEPIG) formed bumps, or the like. The solder material 405 may include a conductive material such as solder, copper, aluminum, gold, nickel, silver, palladium, tin, the like, or a combination thereof. In some embodiments, the solder material 405 is formed by initially forming a layer of solder through evaporation, electroplating, printing, solder transfer, ball placement, or the like. Once a layer of solder has been formed on the conductive connectors 403, a reflow may be performed in order to shape the material into the desired shapes.

The local interconnect device 401 may be placed on the first redistribution structure 120, for example, using e.g., a pick-and-place process. In some embodiments, once the solder material 405 of the local interconnect device 401 is in physical contact with the first conductive layer 201, a reflow process may be performed to bond the solder material 405 to the first conductive layer 201 and thus attach the local interconnect device 401 to the first carrier substrate 101.

In some embodiments, the local interconnect device 401 comprise one or more layers of electrical routing 407 (e.g., redistribution layers (RDLs), metallization patterns, metal lines and through interconnect device vias 409, or the like) formed over a substrate 411. In some embodiments, a local interconnect device 401 comprising electrical routing 407 is used to form interconnections or additional routing between other devices in a package, such as semiconductor devices, dies, chips, or the like. In some embodiments, the local interconnect device 401 comprises one or more active devices (e.g., transistors, diodes, or the like) and/or one or more passive devices (e.g., capacitors, resistors, inductors, or the like). In some embodiments, the local interconnect device 401 includes electrical routing 407 and is substantially free of active or passive devices. In some embodiments, an local interconnect device 401 may have a thickness (excluding thicknesses of the conductive connectors 403 or the solder material 405) that is between about 10 μm and about 100 μm. In some embodiments, an local interconnect device 401 may have lateral dimensions between about 2 mm by 2 mm and about 80 mm by 80 mm, such as about 2 mm by 3 mm or 50 mm by 80 mm. According to some embodiments, the through interconnect device vias 409 may have a second width W2 of between about 10 μm and about 50 μm, such as about 15 μm. However, any suitable width may be utilized.

The local interconnect device 401 may be formed using applicable manufacturing processes. The substrate 411 may be, for example, a semiconductor substrate, such as silicon, which may be doped or undoped, and which may be a silicon wafer or an active layer of a semiconductor-on-insulator (SOI) substrate, or the like. The semiconductor substrate may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

The electrical routing 407 may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). For example, in some embodiments, a damascene process is utilized in which the respective dielectric layer is patterned and etched utilizing photolithography techniques to form trenches corresponding to the desired pattern of metallization layers and/or vias. An optional diffusion barrier and/or optional adhesion layer may be deposited and the trenches may be filled with a conductive material. Suitable materials for the barrier layer includes titanium, titanium nitride, tantalum, tantalum nitride, or other alternatives, and suitable materials for the conductive material include copper, silver, gold, tungsten, aluminum, combinations thereof, or the like. In an embodiment, the metallization layers may be formed by depositing a seed layer of copper or a copper alloy, and filling the trenches by electroplating. A chemical mechanical planarization (CMP) may be used to remove excess conductive material from a surface of the respective dielectric layer and to planarize the surface for subsequent processing.

In some embodiments, the electrical routing 407 of a local interconnect device 401 may comprise fine-pitch RDLs having a pitch less than about 0.6 µm. The fine-pitch RDLs may be formed, for example, using single damascene and/or dual damascene processes, described above. By forming electrical routing 407 having a fine pitch, the density of the electrical routing 407 in a local interconnect device 401 may be increased, thus improving the routing ability of the local interconnect device 401. According to some embodiments, the local interconnect device 401 may be formed with through interconnect device vias 409. According to some embodiments, the through interconnect device vias 409 may be formed by initially forming openings in the substrate 411 of the local interconnect device 401. The openings may be formed using one or more etching processes to remove materials of the substrate 411. Once the openings have been formed, a conductive fill material may be deposited to fill and/or overfill the openings in the substrate 411. The conductive fill material may be a conductive material such as that used to form the electrical routing 407 407, the first through molding vias 301, the first conductive layer 201, as discussed above, or may be any other suitable conductive material. Once deposited, a chemical mechanical planarization (CMP) process, or a series of etches, may be performed to planarize surfaces of the through interconnect device vias 409 with the substrate 411, and the electrical routing 407 may then be formed.

Once the local interconnect device 401 has been attached, a first underfill 413 is deposited in the gap between the local interconnect device 401 and the first dielectric layer 107. The first underfill 413 may be a material such as a molding compound, an epoxy, an underfill, a molding underfill (MUF), a resin, or the like. The first underfill 413 can protect the conductive connectors 403 and provide structural support for the local interconnect device 401. In some embodiments, the first underfill 413 may be cured after application.

Figure 5:
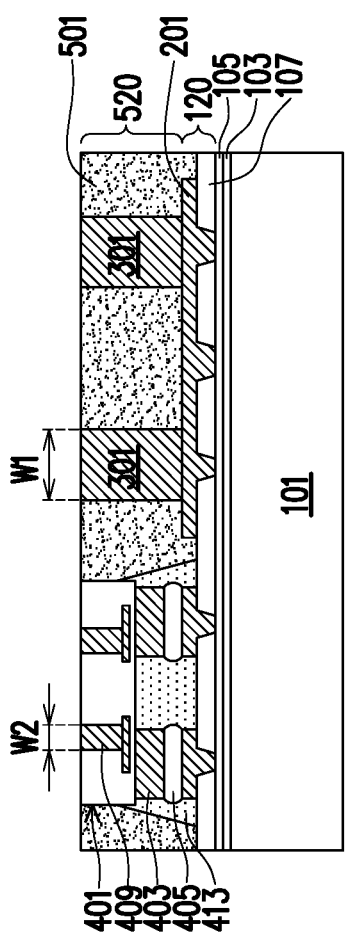

Turning to FIG. 5, the local interconnect device 401 and the first through molding vias 301 are encapsulated using a first encapsulant 501, in accordance with some embodiments. The encapsulation (e.g., CMC Molding) may be performed in a molding device, which may comprise a top molding portion and a bottom molding portion separable from the top molding portion. When the top molding portion is lowered to be adjacent to the bottom molding portion, a molding cavity may be formed for the first carrier substrate 101, the local interconnect device 401, and the first through molding vias 301.

During the encapsulation process the top molding portion may be placed adjacent to the bottom molding portion, thereby enclosing the first carrier substrate 101, the local interconnect device 401, and the first through molding vias 301 within the molding cavity. Once enclosed, the top molding portion and the bottom molding portion may form an airtight seal in order to control the influx and outflux of gasses from the molding cavity. Once sealed, the first encapsulant 501 may be placed within the molding cavity. The first encapsulant 501 may be a liquid first molding compound resin such as polyimide, PPS, PEEK, PES, epoxy molding compound (EMC), a heat resistant crystal resin, combinations of these, or the like. The first encapsulant 501 may be placed within the molding cavity prior to the alignment of the top molding portion and the bottom molding portion, or else may be injected into the molding cavity through an injection port.

Once the first encapsulant 501 has been placed into the molding cavity such that the first encapsulant 501 encapsulates the first carrier substrate 101, the local interconnect device 401, and the first through molding vias 301; the first encapsulant 501 may be cured in order to harden the first encapsulant 501 for protection. While the exact curing process is dependent at least in part on the particular material chosen for the first encapsulant 501, in an embodiment in which molding compound is chosen as the first encapsulant 501, the curing could occur through a process such as heating the first encapsulant 501 to between about 100° C. and about 130° C., such as about 125° C. for about 60 sec to about 3600 sec, such as about 600 sec. Additionally, initiators and/or catalysts may be included within the first encapsulant 501 to better control the curing process.

However, as one having ordinary skill in the art will recognize, the curing process described above is merely an exemplary process and is not meant to limit the current embodiments. Other curing processes, such as irradiation or even allowing the first encapsulant 501 to harden at ambient temperature, may also be used. Any suitable curing process may be used, and all such processes are fully intended to be included within the scope of the embodiments discussed herein.

FIG. 5 further illustrates a planarization process that is performed on the first encapsulant 501, in accordance with some embodiments. The planarization process may be performed, e.g., using a mechanical grinding process, a chemical mechanical polishing (CMP) process, a series of etches, and other removal processes, or the like. The planarization process removes excess portions of the first encapsulant 501 and exposes the through interconnect device vias 409 of the local interconnect device 401 and the first through molding vias 301. In some embodiments, the planarization process may comprise a thinning technique (e.g., a grinding process) used to thin the first encapsulant 501 and reduce a backside of the local interconnect device 401 to a desired height and/or to expose the through interconnect device vias 409. After the planarization process, the first through molding vias 301, the local interconnect device 401, and/or the through interconnect device vias 409 may have surfaces level with a surface of the first encapsulant 501.

Figure 6:
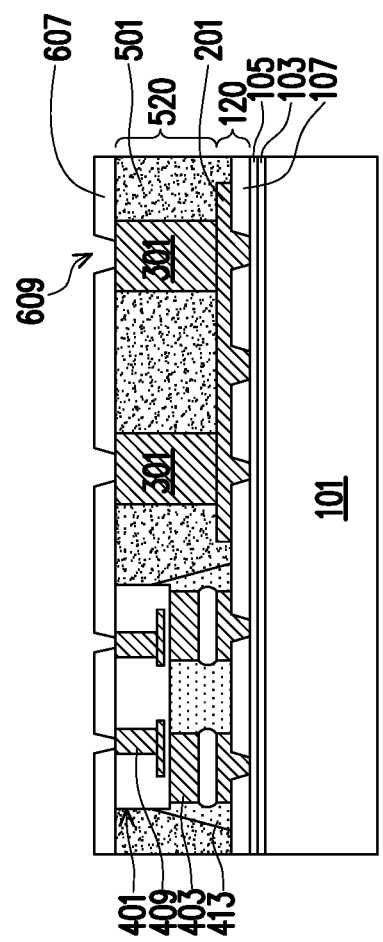

Turning to FIG. 6, this figure illustrates a formation of a second dielectric layer 607 in an initial step of forming a first back-side local interconnect structure 720, in accordance with an embodiment. Once the local interconnect layer 520 has been formed, the second dielectric layer 607 is formed over the first encapsulant 501, the local interconnect device 401, the first through molding vias 301, and/or the through interconnect device vias 409. The second dielectric layer 607 may be formed using any of the materials (e.g., (PBO)) and using any of the deposition processes (e.g., spin-coating process) suitable to form the first dielectric layer 107 of the first redistribution structure 120, as discussed above. After the second dielectric layer 607 has been formed, second openings 609 may be made through the second dielectric layer 607. The second openings 609 may be formed using any of the photolithographic masking and etching processes suitable for forming the openings 109 in the first dielectric layer 107, as discussed above.

Figure 7:
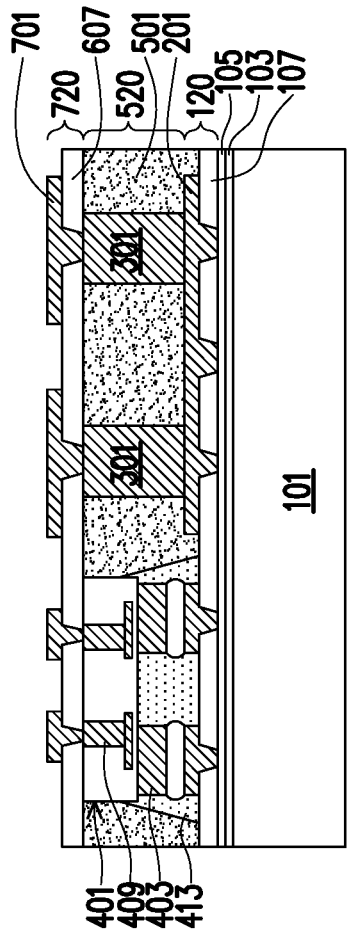

Turning to FIG. 7, this figure illustrates forming a second conductive layer 701 of the first back-side local interconnect structure 720, in accordance with some embodiments. Once the second openings 609 have been patterned, the second conductive layer 701 is formed over the second dielectric layer 607 and in the second openings 609. The second conductive layer 701 may be formed by initially depositing a third seed layer (not shown) using any of the materials (e.g., titanium copper alloy) and any of the processes (e.g., chemical vapor deposition (CVD)) suitable to form the first seed layer (not shown) in the first conductive layer 201, as discussed above. A photoresist (also not shown) is formed to cover the third seed layer and is then patterned to expose those portions of the third seed layer that are located where the second conductive layer 701 is desired to be located. The photoresist may be formed over the third seed layer and then patterned using any of the materials and any of the processes suitable to form and then pattern the photoresist over the first seed layer, as discussed above.

Once the portions of the third seed layer are exposed through the photoresist in the locations where the second conductive layer 701 is desired to be located, a conductive material is deposited over the third seed layer. The conductive material may comprise any of the materials (e.g., copper) and may be deposited using any of the processes (e.g., plating) that are suitable to form the first conductive layer 201, as set forth above. According to some embodiments, the second conductive layer 701 may be formed to any thickness (e.g., 5 μm) that is suitable for the first conductive layer 201. As such, the conductive material of the second conductive layer 701 comprises a single seed layer and has a continuous material from a point within the second dielectric layer 607 to a point over the second dielectric layer 607. Once the second conductive layer 107 has been formed, the photoresist is removed through a process such as ashing. Additionally, after the removal of the photoresist, those portions of the third seed layer that were covered by the photoresist may be removed using e.g., an etch process and the second conductive layer 701 as a mask. The second dielectric layer 607 and the second conductive layer 701 may be collectively referred to herein as the first back-side local interconnect structure 720.

By forming the second conductive layer 701 as a connection layer to the first through molding vias 301, silicon current leakage may be reduced from the local interconnect device 401. Additionally, pitting issues that can arise during subsequent molding processes (such as clear molding compound (CMC) molding processes) may be avoided by forming the second conductive layer 701 along with its associated second dielectric layer 607, while still being able to provide a route for power and ground between the local interconnect device 401 and subsequently formed external connectors (such as a ball grid array).

Once the first back-side local interconnect structure 720 has been formed, other metallization layers may be formed over the first back-side local interconnect structure 720 overlying one another in a stack of metallization layers by repeating steps similar to those used to form the second dielectric layer 607 and the second conductive layer 701. These steps may be repeated as desired in order to electrically connect each overlying metallization layer to an underlying metallization layer, and may be repeated as often as desired until an uppermost metallization layer has been formed. In some embodiments, the second dielectric layer 607 and the second conductive layer 701 serve as the uppermost metallization layer of the first back-side local interconnect structure 720. In an embodiment, the first back-side local interconnect structure 720 may comprise two metallization layers, although any suitable number of individual metallization layers may be utilized.

Figure 8:
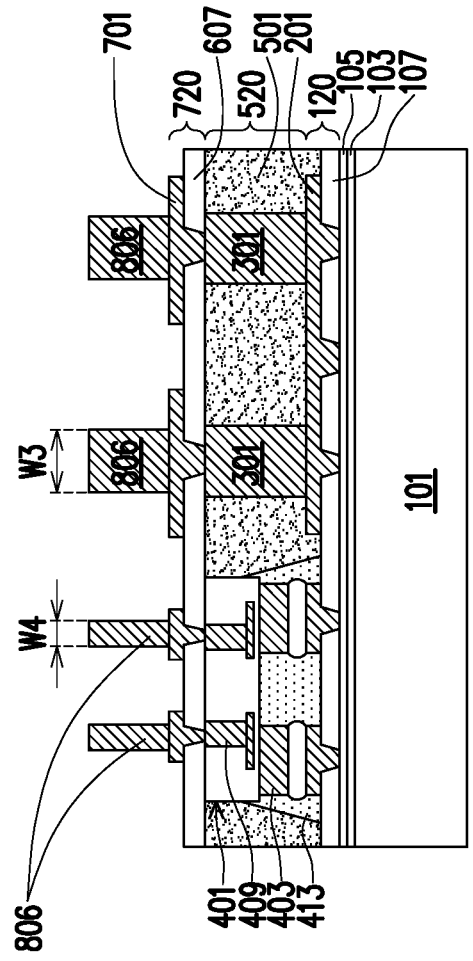

FIG. 8 illustrates the formation of second through molding vias 806 in an initial step in forming a second redistribution layer 920 over the first back-side local interconnect structure 720, according to some embodiments. The second through molding vias 806 may be formed over the second conductive layer 701 of an underlying metallization layer using a seed layer, a photoresist, a lithographic process, and a plating process in a similar process to that used for forming the first through molding vias 301, described above. According to some embodiments, the second through molding vias 806 may be formed to a third width W3 over the first through molding vias 301, the third width being between about 10 μm and about 80 μm, such as about 30 μm. In some embodiments, a ratio of the third width W3 of the second through molding vias 806 to the first width W1 of the first through molding vias 301 may be between about 1:1 and about 0.8:1, such as about 0.6:1. However, any suitable widths and any suitable ratios may be used.

According to some embodiments, the second through molding vias 806 may be formed to a fourth width W4 over the through interconnect device vias 409, the fourth width W4 being between about 10 μm and about 50 μm, such as about 15 μm. In some embodiments, a ratio of the fourth width W4 of the second through molding vias 806 to the second width W2 of the through interconnect device vias 409 may be about 1:1. However, any suitable widths and any suitable ratios may be used.

Figure 9:
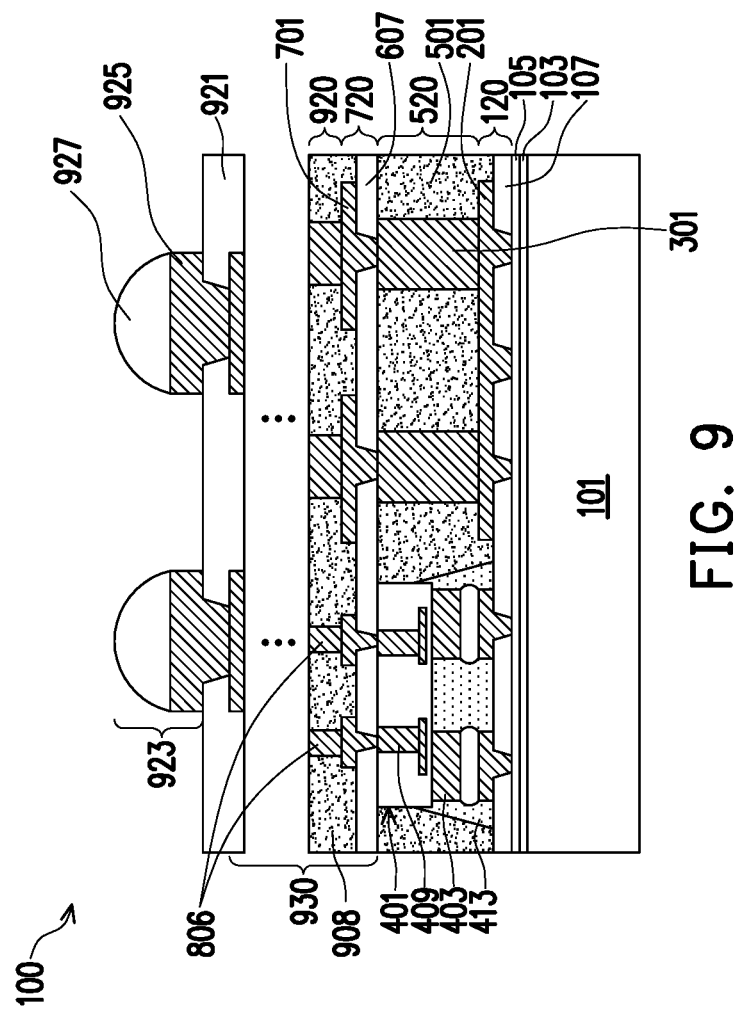

FIG. 9 illustrates an encapsulation of the second through molding vias 806 and formation of first external connectors 923 of the first interconnect structure 100, according to some embodiments. Once the second through molding vias 806 have been formed, a second encapsulant 908 may then be formed over the second through molding vias 806. According to some embodiments, the second encapsulant 908 may be formed using a dielectric lamination process to encapsulate the second through molding vias 806, although any suitable method of placing the second encapsulant 908 such as transfer molding or the like may be utilized. In some embodiments, the lamination process may be performed by initially placing a laminate sheet of dielectric material over the exposed surfaces of the second through molding vias 806 and the first back-side local interconnect structure 720. The laminate sheet may be a dielectric material such as a molding compound, according to an embodiment. However, other suitable materials that may be used for the laminate sheet include, but are not limited to, an Ajinomoto build up film (ABF), a pre-impregnated (prepreg) material with a filler or a fiber inside, an epoxy, a phenolic ester, a cyanate ester, a phenol, a filler, glass fibers, combinations of these, or the like. However, any suitable materials may also be used. Once placed, the dielectric laminate sheet is subjected to process conditions (e.g., temperatures, pressures, times) used to laminate the second encapsulant 908 to the exposed surfaces of the first back-side local interconnect structure 720 and the second through molding vias 806. Once laminated, a thinning process may be performed to planarize the surface of the second encapsulant 908 with the second through molding vias 806. According to some embodiments, the second redistribution layer 920 may be formed to a thickness between about 1 μm and about 50 μm, such as about 20 μm, although any suitable thickness may be used. Furthermore, the second through molding vias 806 and the second encapsulant 908 may be collectively referred to herein as a metallization layer of the second redistribution structure 930.

In addition, further metallization layers may be formed over the second redistribution layer 920 until an uppermost metallization layer of the second redistribution structure 930 has been formed. The further metallization layers may be formed by repeating the steps to form the second dielectric layer 607 and the second conductive layer 701 as a further metallization layer and/or by repeating the steps to form the second through molding vias 806 and the second encapsulant 908 as a further metallization layer. As such, the first back-side local interconnect structure 720, the second redistribution layer 920 and any further metallization layers form the second redistribution structure 930 having a suitable number and configuration of metallization layers is provided.

Once the second redistribution structure 930 has been formed, a third passivation layer 921 may be formed over the second redistribution structure 930 in order to provide protection and isolation for the second redistribution structure 930 and the other underlying structures. The third passivation layer 921 may be polybenzoxazole (PBO), although any suitable material, such as polyimide or a polyimide derivative may be utilized. The third passivation layer 921 may be placed using, e.g., a spin-coating process to a thickness of between about 5 μm and about 25 μm, such as about 7 μm, although any suitable method and thickness may also be used.

FIG. 9 further illustrates a formation of the first external connectors 923 to make electrical contact with the second redistribution structure 930. In an embodiment after the third passivation layer 921 has been formed, a plurality of openings may be made through the third passivation layer 921 to expose the uppermost metallization layer in the second redistribution structure 930 in desired locations for the first external connectors 923. The openings may be formed using a suitable photolithographic mask and etching process, although any suitable process to expose the uppermost metallization layer in the second redistribution structure 930 may be used.

In an embodiment the first external connectors 923 may be placed on the uppermost metallization layer through the third passivation layer 921 and may collectively form a ball grid array (BGA) which comprises a eutectic material such as solder, although any suitable materials may also be used. In some embodiments, the first external connectors 923 comprise first under-bump metallization 925 (UBMs) formed through the third passivation layer 921 in the openings over the second redistribution structure 930 and first solder bumps 927 formed over the first under-bump metallizations 925. The first under-bump metallizations 925 may be formed through one or more deposition and patterning processes. In some embodiments, the first under-bump metallizations 925 may be formed by, for example, initially forming a seed layer over the third passivation layer 921 and then patterning the seed layer to remain in the areas for forming the first external connectors 923. The seed layer may be deposited and patterned using any of the materials and processes discussed above for forming seed layers. Once the seed layer has been formed, the first under-bump metallizations 925 may be formed over the patterned seed layer.

In some embodiments, the first under-bump metallizations 925 include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the first under-bump metallizations 925. Any suitable materials or layers of material that may be used for the first under-bump metallizations 925 are fully intended to be included within the scope of the current application. The conductive material (e.g., the layers) of the first under-bump metallizations 925 may be formed using one or more plating processes, such as electroplating or electroless plating processes, although other processes of formation, such as sputtering, evaporation, or a PECVD process, may alternatively be used. Once the conductive material of the first under-bump metallizations 925 has been formed, portions of the photoresist layer may be removed, e.g., by ashing. Once the photoresist has been removed, the exposed portions of the seed layer may be removed by an etching process using the first under-bump metallizations 925 as a mask.

In an embodiment in which the first external connectors 923 are first solder bumps 927, the first external connectors 923 may be formed of solder using a ball drop method, such as a direct ball drop process. The first solder bumps 927 also may be formed by initially forming a layer of tin through any suitable method such as evaporation, electroplating, printing, or solder transfer, and then performing a reflow in order to shape the material into the desired bump shape.

Figure 10:
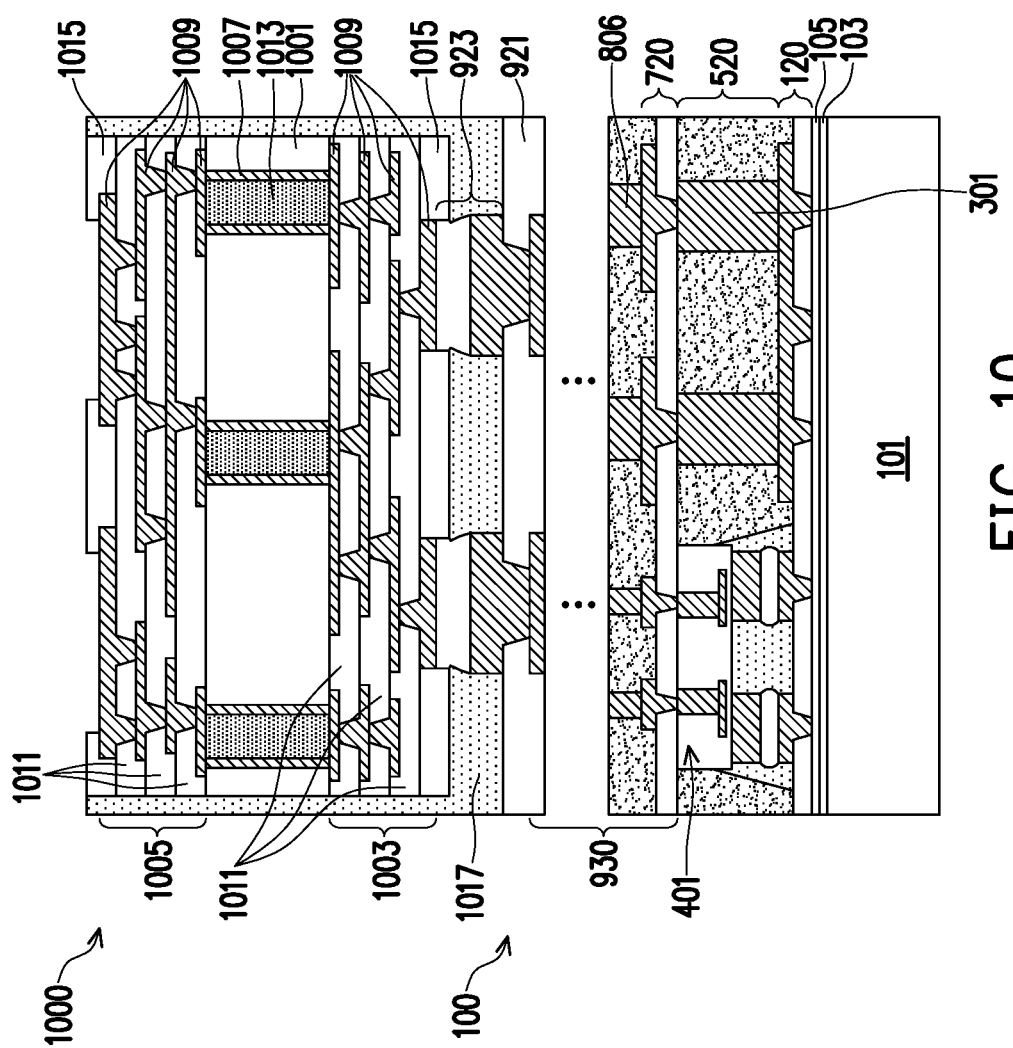
FIGS. 10 to 12 illustrate cross-sectional views of intermediate steps of forming a first system interconnect package using the first interconnect structure, in accordance with some embodiments.

FIG. 10 illustrates the attachment of an interposer structure 1000 to the first interconnect structure 100, in accordance with some embodiments. The interposer structure 1000 provides additional routing and stability to the first interconnect structure 100. For example, the interposer structure 1000 can reduce warping of the first interconnect structure 100, especially for interconnect structures having large areas (e.g., greater than about 90 mm$^2$).

According to some embodiments, the interposer structure 1000 may be, for example, an interposer connection device or a "semi-finished substrate," and may be free of active devices. In some embodiments, the interposer structure 1000 comprises a core substrate 1001, a first routing structure 1003 and a second routing structure 1005, the first routing structure 1003 and the second routing structure 1005 being located on opposite sides of the core substrate 1001. The core substrate 1001 may include a material such as Ajinomoto build-up film (ABF), a pre-impregnated composite fiber (prepreg) material, an epoxy, a molding compound, an epoxy molding compound, fiberglass-reinforced resin materials, printed circuit board (PCB) materials, silica filler, polymer materials, polyimide materials, paper, glass fiber, non-woven glass fabric, glass, ceramic, other laminates, the like, or combinations thereof. In some embodiments, the core substrate 1001 may be a double-sided copper-clad laminate (CCL) substrate or the like. According to some embodiments, the core substrate 1001 may have a thickness between about 30 μm and about 2000 μm, such as about 500 μm or about 1200 μm.

The interposer structure 1000 may further comprise through-substrate vias 1007 (TSVs) extending through the core substrate 1001. The first routing structure 1003, the second routing structure 1005, and the through-substrate vias 1007 provide additional electrical routing and interconnection. The first routing structure 1003 and the second routing structure 1005 may include one or more routing layers 1009 and one or more dielectric layers 1011. In some embodiments, the routing layers 1009 and the through-substrate vias 1007 comprise one or more layers of copper, nickel, aluminum, other conductive materials, combinations, and the like. Although the interposer structure 1000 is illustrated as having two routing structures with each of the routing structures comprising three dielectric layers 1011 and four routing layers 1009 on each side of the core substrate 1001, according to an embodiment, the interposer structure 1000 may have any suitable number of the dielectric layers 1011 and the routing layers 1009. Furthermore, the interposer structure 1000 may have more or fewer of the dielectric layers 1011 and the routing layers 1009 formed on either side of the core substrate 1001.

In some embodiments, the openings in the core substrate 1001 for the through-substrate vias 1007 may be filled with a filler material 1013. The filler material 1013 may provide structural support and protection for the conductive material of the through-substrate vias 1007. In some embodiments, the filler material 1013 may be a material such as a molding material, epoxy, an epoxy molding compound, a resin, and materials including monomers or oligomers, such as acrylated urethanes, rubber-modified acrylated epoxy resins, or multifunctional monomers, combinations, or the like. In some embodiments, the filler material 1013 may include pigments or dyes (e.g., for color), or other fillers and additives that modify rheology, improve adhesion, or affect other properties of the filler material 1013. In some embodiments, the conductive material of the through-substrate vias 1007 may completely fill the through-substrate vias 1007, omitting the filler material 1013.

In some embodiments, the interposer structure 1000 may include a passivation layer 1015 formed over one or more sides of the interposer structure 1000. The passivation layer 1015 may be a material such as a nitride, an oxide, a polyimide, a low-temp polyimide, a solder resist, combinations thereof, or the like. Once formed, the passivation layer 1015 may be patterned (e.g., using a suitable photolithographic and etching process) to expose portions of the routing layers 1009 of the first routing structure 1003 and the second routing structure 1005.

FIG. 10 further illustrates a placement of the interposer structure 1000 into electrical connection with the first interconnect structure 100, in accordance with some embodiments. The interposer structure 1000 may be placed into physical contact with the first external connectors 923 of the first interconnect structure 100 using, e.g., a pick and place process. The interposer structure 1000 may be placed such that exposed regions of the topmost routing layer of a routing structure (e.g., the first routing structure 1003) are aligned with corresponding ones of the first external connectors 923 of the first interconnect structure 100. Once in physical contact, a reflow process may be utilized to bond the first external connectors 923 of the first interconnect structure 100 to the interposer structure 1000. In some embodiments, external connectors are formed on the interposer structure 1000 instead of or in addition to the first external connectors 923 formed on the first interconnect structure 100. In some embodiments, first external connectors 923 are not formed on the first interconnect structure 100, and the interposer structure 1000 is bonded to the first interconnect structure 100 using a direct bonding technique such as a thermo-compression bonding technique.

FIG. 10 further illustrates that a second underfill 1017 is deposited along the sidewalls of the interposer structure 1000 and in the gap between the interposer structure 1000 and the first interconnect structure 100. The second underfill 1017 may be a material such as a molding compound, an epoxy, an underfill, a molding underfill (MUF), a resin, or the like. The second underfill 1017 can protect the first external connectors 923 and provide structural support for the first interconnect structure 100. According to some embodiments, the second underfill 1017 may also be formed along the sidewalls of the first interconnect structure 100. In some embodiments, the second underfill 1017 may be cured after deposition.

Figure 11:
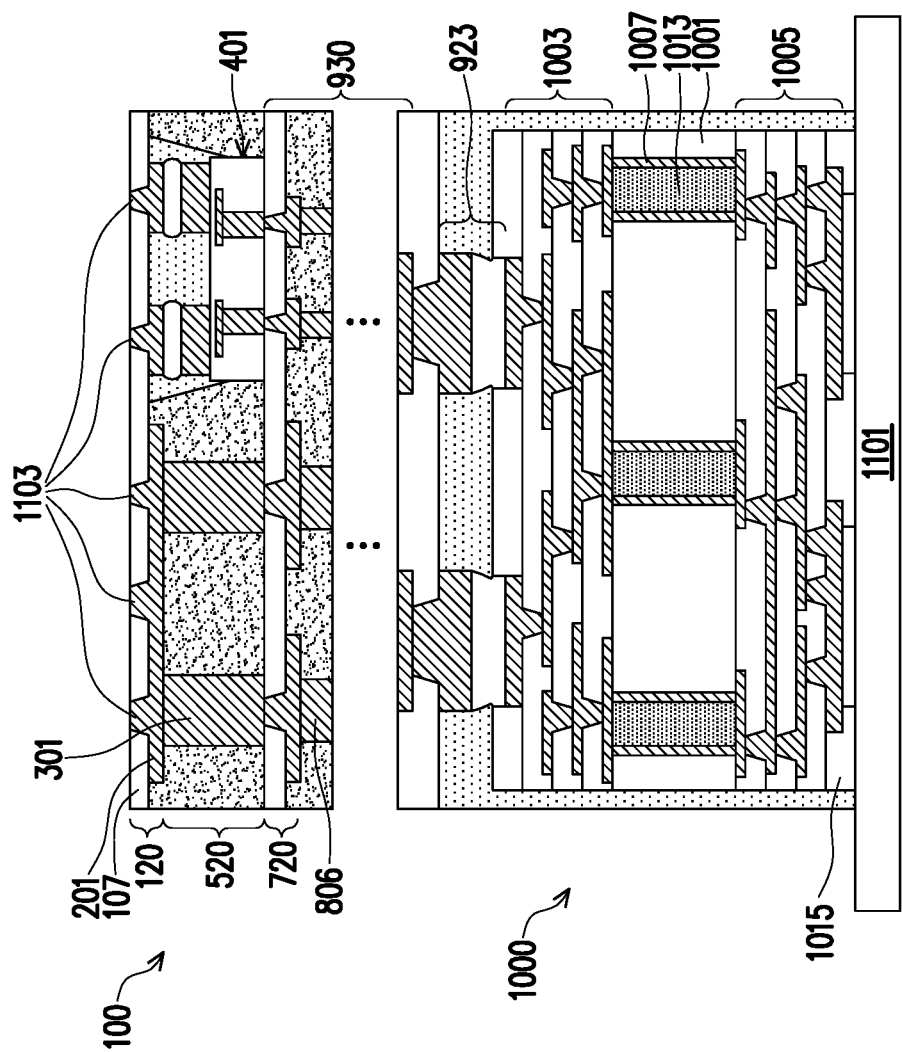

Turning to FIG. 11, the first carrier substrate 101 is de-bonded to detach (or "de-bond") the first carrier substrate 101. The structure is then flipped over and a side of the interposer structure 1000 opposite the first interconnect structure 100 is attached to a second carrier substrate 1101, in accordance with some embodiments. In some embodiments, the de-bonding includes projecting a light such as a laser light or an UV light on the release layer 103 on the first carrier substrate 101 so that the release layer 103 decomposes under the heat of the light and the first carrier substrate 101 can be removed. The second carrier substrate 1101 may be a carrier substrate similar to those described above for the first carrier substrate 101. For example, the second carrier substrate 1101 may be a wafer or a panel. Another release layer (not shown) may be formed on the second carrier substrate 1101 to facilitate attachment of the structure to the second carrier substrate 1101. After attachment, an optional planarization process (e.g., a grinding process or a CMP process) may be performed on the first interconnect structure 100 to remove the polymer layer 105 and expose contact areas 1103 of the first conductive layer 201.

Figure 12:
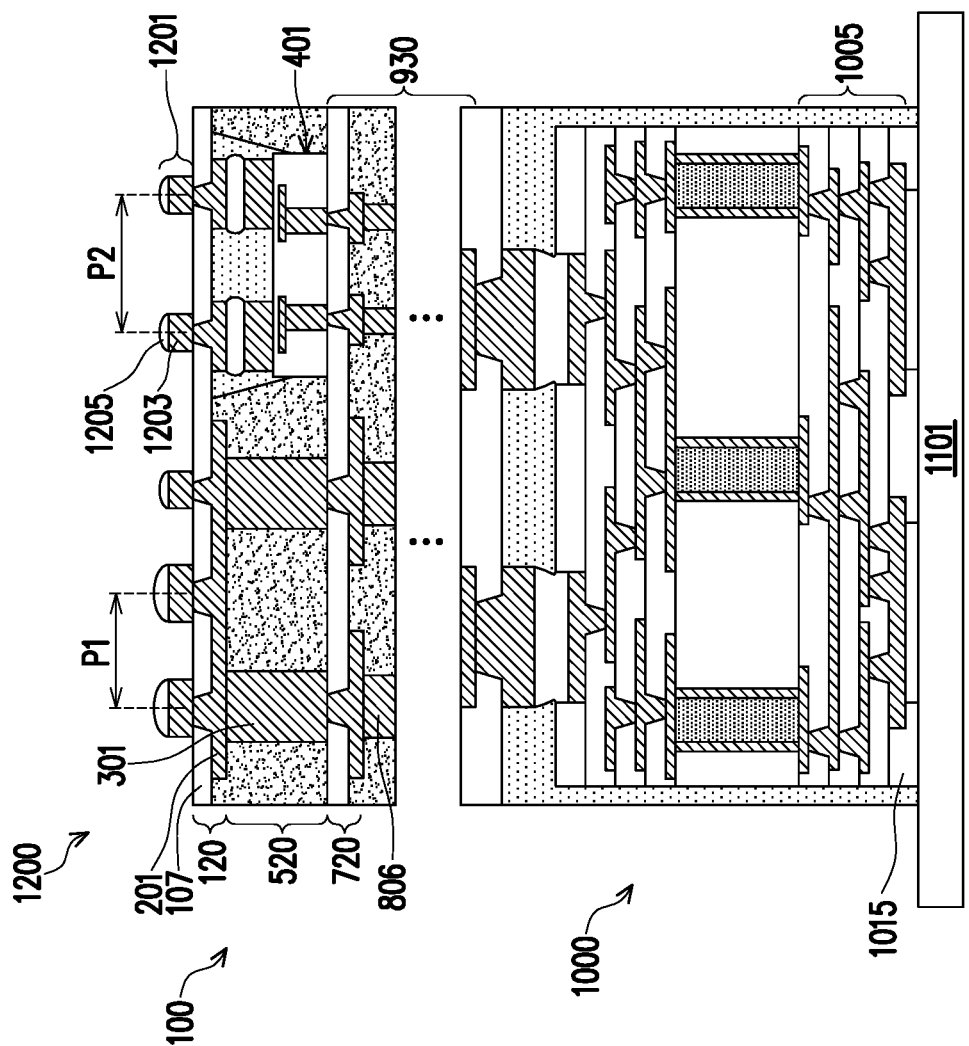

Turning to FIG. 12, this figure illustrates the formation of second external connectors 1201 over the contact areas 1103 shown in FIG. 11. According to some embodiments, the second external connectors 1201 comprises second under-bump metallizations 1203 (UBMs) and second solder bumps 1205 that are formed on and electrically connect to the first conductive layer 201.

In some embodiments, the second under-bump metallizations 1203 may be formed by, for example, initially forming a seed layer over the first dielectric layer 107 and on the contact areas 1103 and then patterning the seed layer to remain in the areas for forming the second external connectors 1201. The seed layer may be deposited and patterned using any of the materials and processes discussed above for forming seed layers. Once the seed layer has been formed, the second under-bump metallizations 1203 may be formed over the patterned seed layer. In some embodiments, the second under-bump metallizations 1203 include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the second under-bump metallizations 1203. Any suitable materials or layers of material that may be used for the second under-bump metallizations 1203 are fully intended to be included within the scope of the current application. The conductive material (e.g., the layers) of the second under-bump metallizations 1203 may be formed using one or more plating processes, such as electroplating or electroless plating processes, although other processes of formation, such as sputtering, evaporation, or a PECVD process, may alternatively be used. Once the conductive material of the second under-bump metallizations 1203 has been formed, portions of the photoresist layer may be removed, e.g., by ashing. Once the photoresist has been removed, the exposed portions of the seed layer may be removed by an etching process using the second under-bump metallizations 1203 as a mask.

Still referring to FIG. 12, the second solder bumps 1205 are formed over the second under-bump metallizations 1203. In some embodiments, the second solder bumps 1205 may be controlled collapse chip connection (C4) bumps, micro bumps (e.g., µbumps), ball grid array (BGA) connectors, solder balls, electroless nickel-electroless palladium-immersion gold technique (ENEPIG) formed bumps, or the like. The second solder bumps 1205 may include a conductive material such as solder, copper, aluminum, gold, nickel, silver, palladium, tin, the like, or a combination thereof. In some embodiments, the second solder bumps 1205 are formed by initially forming a layer of solder through evaporation, electroplating, printing, solder transfer, ball placement, or the like. Once a layer of solder has been formed on the second under-bump metallizations 1203, a reflow may be performed in order to shape the material into the desired shapes.

According to some embodiments the second external connectors 1201 are formed as both controlled collapse chip connection (C4) bumps and micro bumps. In this embodiment, the controlled collapse chip connection (C4) bumps may be formed with a first pitch P1 of between about 60 µm and about 180 µm, such as about 90 µm, and the micro bumps may be formed with a second pitch P2 of between about 15 µm and about 50 µm, such as about 32 µm. As such, the first system interconnect package 1200 may be formed with external connectors having a fine pitch.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 13:
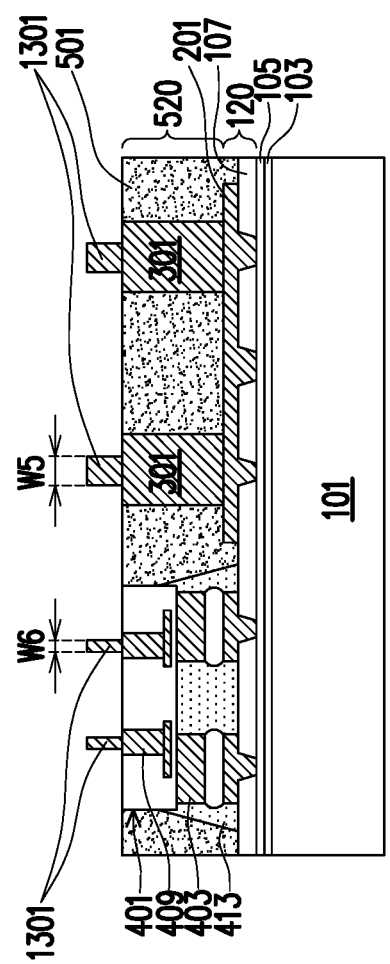
FIGS. 13 and 14 illustrate cross-sectional views of intermediate steps of forming a second interconnect structure, in accordance with some other embodiments.
Figure 14:
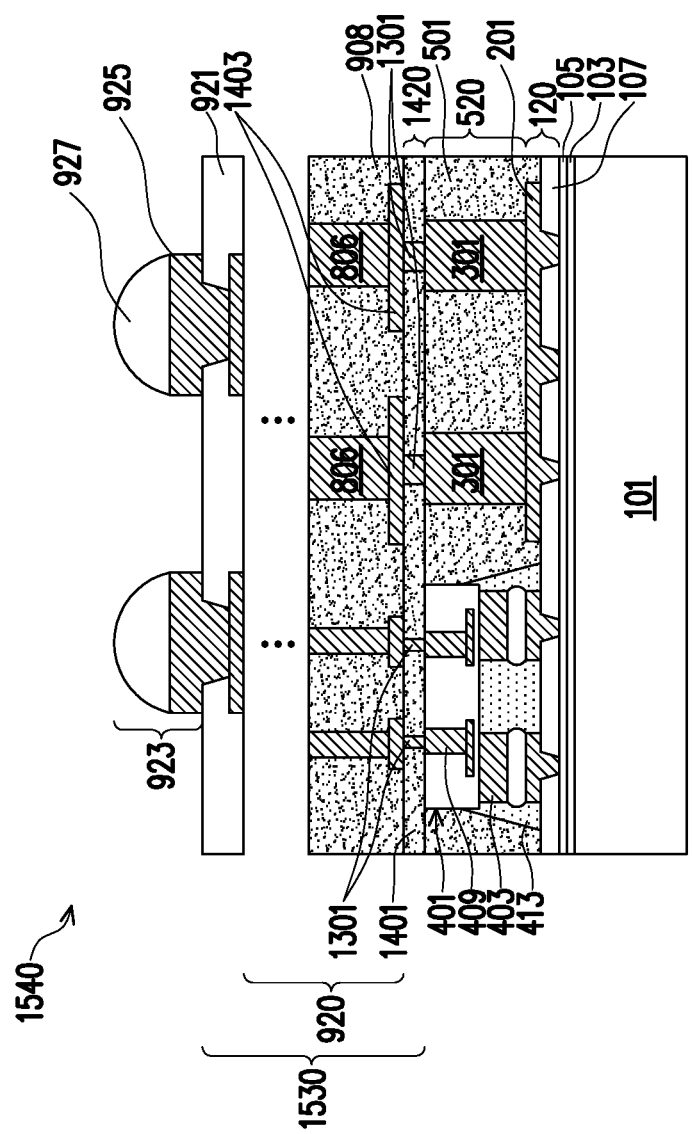

Turning to FIGS. 13 and 14, these figures illustrate intermediate steps in forming a second interconnect structure 1540, in accordance with another embodiment. The second interconnect structure 1540 is similar to the first interconnect structure 100; however, the second interconnect structure 1540 comprises a second back-side local interconnect structure 1420 adjacent the local interconnect layer 520 instead of the first back-side local interconnect structure 720. FIGS. 13 and 14 are similar to FIGS. 6 and 7, respectively. However, FIGS. 13 and 14 are directed towards the formation of the second back-side local interconnect structure 1420 over the local interconnect layer 520 of FIG. 5, whereas FIGS. 6 and 7 are directed towards forming the first back-side local interconnect structure 720 over the local interconnect layer 520 of FIG. 5.

In particular, FIG. 13 illustrates the formation of conductive via plugs 1301 over the first through molding vias 301 and the through interconnect device vias 409 of the local interconnect layer 520, in an initial step in forming the second back-side local interconnect structure 1420. The conductive via plugs 1301 may be formed over the first through molding vias 301 using a seed layer, a photoresist, lithographic process, and a plating process in a similar process to that used for forming the first through molding vias 301 and/or the second through molding vias 806, described above. According to some embodiments, the conductive via plugs 1301 may be formed to a fifth width W5 over the first through molding vias 301, the fifth width being between about 5 µm and about 70 µm, such as about 25 µm. In some embodiments, a ratio of the fifth width W5 of the conductive via plugs 1301 to the first width W1 of the first through molding vias 301 may be between about 0.5:1 and about 0.875:1, such as about 0.833:1. According to some embodiments, the conductive via plugs 1301 may be formed to a sixth width W6 over the through interconnect device vias 409, the sixth width W6 being between about 5 µm and about 40 µm, such as about 10 µm. In some embodiments, a ratio of the sixth width W6 of the conductive via plugs 1301 to the second width W2 of the through interconnect device vias 409 may be between about 0.5:1 and about 0.8:1, such as about 0.67:1. However, any suitable widths and any suitable ratios may be used.

FIG. 14 illustrates the formation of a third encapsulant 1401 over the conductive via plugs 1301 and the exposed surfaces of the local interconnect layer 520, according to some embodiments. The third encapsulant 1401 may be formed using a dielectric laminate sheet, a lamination process, process conditions (e.g., temperatures, pressures, times), and a thinning process in a similar process to that used for forming the second encapsulant 908, described above or any other suitable process. According to some embodiments, the third encapsulant 1401 may be formed to a thickness between about 1 µm and about 50 µm, such as about 5 µm, although any suitable thickness may be used. As such, the conductive via plugs 1301 and the third encapsulant 1401 form the second back-side local interconnect structure 1420, according to some embodiments.

FIG. 14 additionally illustrates a formation of a third conductive layer 1403 over the conductive via plugs 1301 and the formation of the second through molding vias 806. In an embodiment the third conductive layer 1403 may be formed in a similar fashion and using similar materials as the second conductive layer 701, described above with respect to FIG. 7. For example, a seed layer is placed on top of the third encapsulant 1401 and the conductive via plugs 1301, a photoresist is placed and patterned, the material of the third conductive layer 1403 is plated onto the exposed portions of the seed layer, the photoresist is removed, and exposed portions of the seed layer are then etched away. However, any suitable methods and materials may be utilized to form the third conductive layer 1403.

Once the third conductive layer 1403 has been formed, the second through molding vias 806 may be formed on the third conductive layer 1403. In an embodiment the second through molding vias 806 may be formed as described above with respect to FIG. 8. For example, a seed layer is deposited (or else the third conductive layer 1403 is used as a seed layer), a photoresist is placed and patterned, a plating process is used to plate the material of the second through molding vias 806, the photoresist is removed, and the seed layer (if present) is removed. However, any suitable methods or materials may be utilized to form the second through molding vias 806.

Additionally, after the second through molding vias 806 have been formed, the remainder of the second redistribution layer 920 may be placed. For example, in an embodiment the second encapsulant 908 may be placed over both the second through molding vias 806 and the third conductive layer 1403, and the second encapsulant 908, the second through molding vias 806, and the third conductive layer 1403 may be thinned in order to form the second redistribution layer 920.

Further, once the second redistribution layer 920 has been formed, any further metallization layers that are desired may be formed to manufacture a third redistribution structure 1530 with the second back-side local interconnect structure 1420 instead of the first back-side local interconnect structure 720. After the third redistribution structure 1503 has been formed, the third passivation layer 921 and the first external connectors 923 may be formed over the second back-side local interconnect structure 1420. As such, a second interconnect structure 1540 with the third redistribution structure 1530, according to some other embodiments, may be formed.

By forming the second back-side local interconnect structure 1420 in this fashion, another method is provided which helps to lessen silicon current leakage from the local interconnect device 401. Additionally, such a process is able to lessen this leakage while still providing a route for power and ground between the local interconnect device 401 and subsequently formed external connectors (such as a ball grid array).

Figure 15:
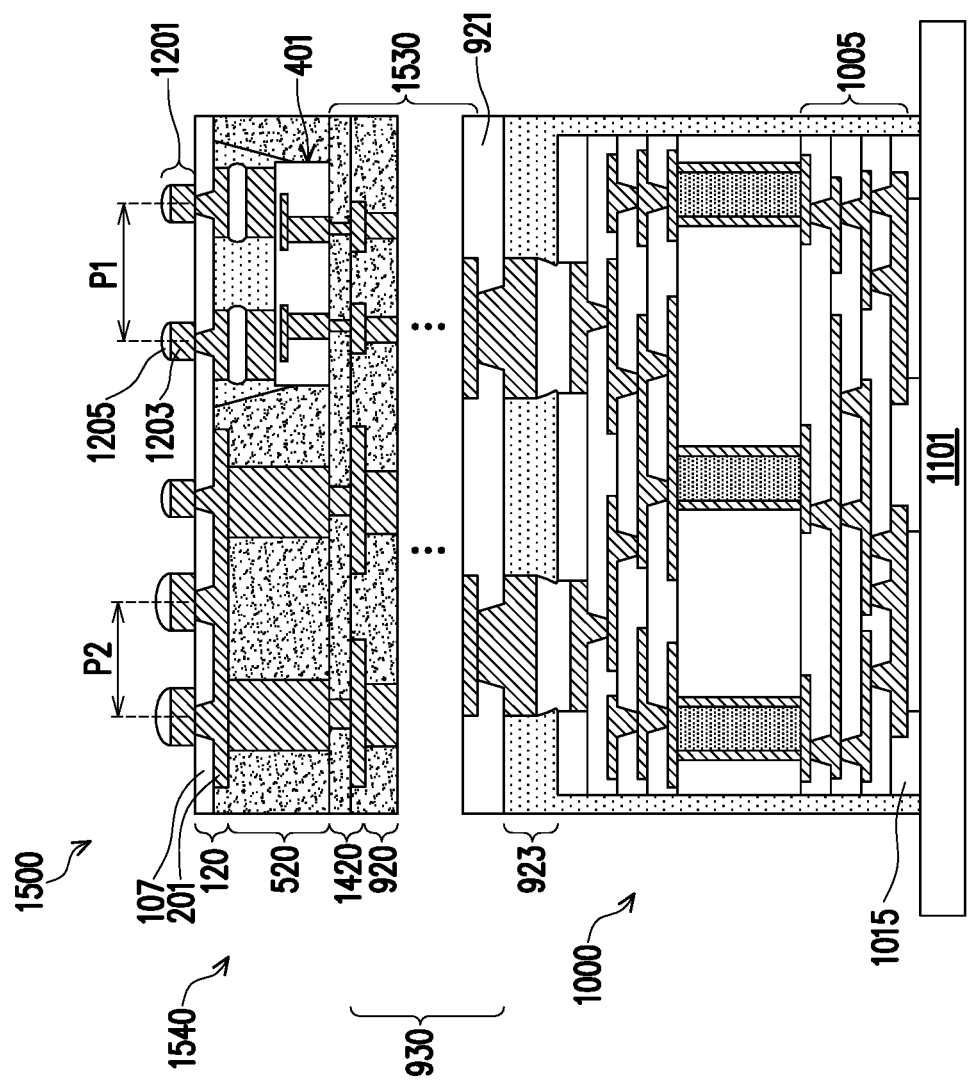
FIG. 15 illustrates a cross-sectional view of an intermediate step of forming a second system interconnect package using the second interconnect structure, in accordance with some embodiments.

FIG. 15 illustrates a second interconnect package 1500 comprising the second interconnect structure 1540, according to another embodiment. FIG. 15 is similar to FIG. 12; however, FIG. 15 illustrates that the second interconnect structure 1540 is attached to the interposer structure 1000 instead of the first interconnect structure 100. In an embodiment the second interconnect structure 1540 may be attached to the interposer structure 1000 as described above with respect to FIG. 10. However, any suitable attaching or bonding process may be utilized.

Figure 16:
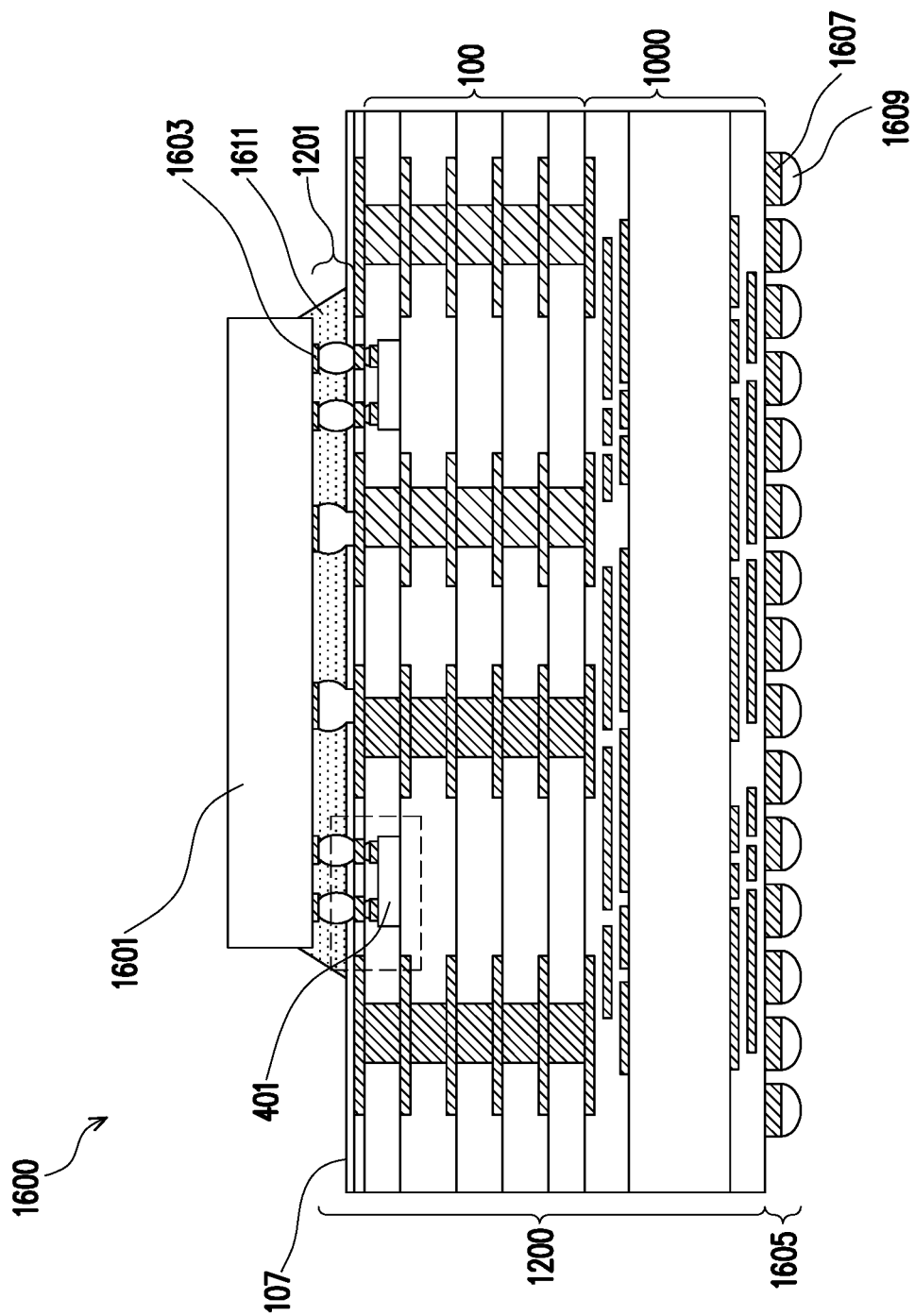
FIG. 16 illustrates a cross-sectional view of a system incorporating the first interconnect package, in accordance with some embodiments.

FIG. 16 illustrates a system package 1600, according to some embodiments. The system package 1600 comprises an enlarged view of the first system interconnect package 1200, a semiconductor device 1601 mounted to the first system interconnect package 1200, and third external connectors 1605 bonded to the first system interconnect package 1200 opposite the semiconductor device 1601, according to some embodiments.

The semiconductor device 1601 e.g., a System-in-Package (SiP) device, may be mounted to the second external connectors 1201 using a pick and place process and a bonding technique similar to the processes used for attaching the interposer structure 1000, discussed above. According to some embodiments, contact pads 1603 of the semiconductor device 1601 are bonded to the second external connectors 1201 using a reflow process. In other embodiments, the second external connectors 1201 are not formed on the first system interconnect package 1200, and the semiconductor device 1601 is bonded to the first system interconnect package 1200 using a direct bonding technique such as a thermo-compression bonding technique or a die-to-die fine line connection. As such, the first system interconnect package 1200 (or the second interconnect package 1500) may be used in super large integrated fan-out (InFO) substrate technology applications.

Once the semiconductor device 1601 has been bonded to the first system interconnect package 1200, a third underfill 1611 may be formed in the gap between the semiconductor device 1601 and the upper surface (e.g., the first dielectric layer 107) of the first system interconnect package 1200. The third underfill 1611 may be formed using an underfill material, a deposition process, and curing process used to form the first underfill 413 or the second underfill 1017, discussed above.

In addition, third external connectors 1605 may be formed over the interposer structure 1000 for external connection to the system package 1600. The third external connectors 1605 may be formed by initially debonding the second carrier substrate 1101 from the first system interconnect package 1200 using a debonding process similar to the debonding process used to remove the first carrier substrate 101 discussed above. The third external connectors 1605 may comprise third underbump metallization (UBMs) (e.g., third UBMs 1607) and third solder bumps 1609 formed over the third UBMs 1607. The third underbump metallization (UBMs) (e.g., third UBMs 1607) and third solder bumps 1609 may be formed using materials and processes similar to those used to form the first under-bump metallizations 925 and first solder bumps 927. The third external connectors 1605 may be formed over the interposer structure 1000 on a side opposite the first interconnect structure 100. Furthermore, the third external connectors 1605 may be formed prior to attaching the semiconductor device 1601 or they may be formed after attaching the semiconductor device 1601.

By utilizing the ideas presented herein, a local interconnect device such as a local silicon interconnect (LSI) and through substrate vias (TSVs) are embedded into, e.g., a system on integrated substrate (SoIS) with a compact package structure. According to some embodiments, a LSI device may be embedded into SoIS technology with through substrate via integration to provide a die-to-die fine line connection arrangement for super large integrated Fan-Out (InFO) for substrate (SBT) technology in a SoIS device. Furthermore, the through substrate via (TSV) connection layer may be formed using lithographic or photoresist defined vias to provide embedded local silicon interconnect (eLSI) power and ground (P/G) out to a ball-grid-array (BGA) connection interface. As such, eLSI Si current leakage and compression molding compound pitting issues are avoided while providing die-to-die interfaces within the (SoIS) device.

In accordance with an embodiment, a method includes: depositing a first dielectric layer over a carrier substrate; depositing a first conductive layer over the first dielectric layer; forming a first through via over the first conductive layer; attaching a local interconnect device to the first conductive layer adjacent to the first through via; encapsulating the local interconnect device and the first through via in a first molding compound; forming a second dielectric layer over the local interconnect device and the first molding compound; forming a second through via over a through interconnect via of the local interconnect device; forming a third through via over the first through via; and encapsulating the third through via and the second through via in a second molding compound. In an embodiment, the method further includes: forming an opening in the second dielectric layer to expose the through interconnect via; and depositing a second conductive layer at least partially in the second opening. In an embodiment the forming the first through via comprises plating a conductive fill material into a patterned photoresist. In an embodiment the method further includes depositing a second conductive layer over the second molding compound and in electrical connection with the second through via and the third through via. In an embodiment the encapsulating the third through via and the second through via comprises laminating the second molding compound. In an embodiment the method further includes forming a first external contact to the first conductive layer on a side of the first dielectric layer opposite the local interconnect device. In an embodiment the method further includes thinning the local interconnect device after the encapsulating the local interconnect device.

In accordance with another embodiment, a method includes: forming a first metallization layer over a substrate; bonding a local interconnect device to the first metallization layer; encapsulating the local interconnect device in a first molding compound; forming a back-side redistribution layer over the local interconnect device and the first molding compound, the back-side redistribution layer being electrically coupled to a through via of the local interconnect device; forming a second conductive via over the back-side redistribution layer; and encapsulating the second conductive via and the back-side redistribution layer in a second molding compound. In an embodiment the forming the back-side redistribution layer further includes: forming a via; encapsulating the via with a dielectric material; and forming a conductive line in physical contact with both the via and the dielectric material. In an embodiment the encapsulating the via is performed at least in part with a lamination process. In an embodiment the forming the back-side redistribution layer further comprises depositing a dielectric material, forming a second opening in the dielectric material to expose the through via of the local interconnect device, and depositing a metal layer at least partially within the second opening. In an embodiment the forming the second conductive via further includes: patterning a photoresist located over the local interconnect device and the first molding compound; plating a conductive material into the photoresist; and removing the photoresist. In an embodiment the method further includes forming a third conductive via on the first metallization layer, wherein the encapsulating the local interconnect device encapsulates the third conductive via. In an embodiment the encapsulating the second conductive via comprises a lamination process. In an embodiment the method further includes: forming a first external connection in electrical connection to the second conductive via; bonding an interposer structure to the first external connection; and forming a second external connection to the first metallization layer.

In accordance with yet another embodiment, a semiconductor device includes: a first redistribution layer; a first molding compound over the first redistribution layer; a local interconnect device embedded in the first molding compound and electrically coupled to the first redistribution layer; a second redistribution layer over the local interconnect device and electrically coupled to a first through via of the local interconnect device; a second molding compound over the second redistribution layer; a second through via embedded in the second molding compound and electrically coupled to the second redistribution layer; a first external connector electrically coupled to the local interconnect device by the first redistribution layer; and a second external connector electrically coupled to the local interconnect device by the second through via. In an embodiment the second redistribution layer comprises a single seed layer. In an embodiment the second redistribution layer comprises a third molding compound, the third molding compound being different from the first molding compound. In an embodiment the semiconductor device further includes a packaged device that is attached to the first external connector. In an embodiment the packaged device is die-to-die bonded to the first external connector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a first through via over a first metallization layer;
attaching an interconnect device to the first metallization layer adjacent to the first through via;
forming a second through via over an interconnect via of the interconnect device, wherein the second through via has a first height and a first width, the second through via having a first bottom surface and a first top surface; and
forming a third through via over the first through via, wherein the third through via has the first height and a second width, the second width being different from the first width, the third through via having a second bottom surface and a second top surface, the first bottom surface being planar with the second bottom surface and the first top surface being planar with the second top surface.

2. The method of claim 1, further comprising encapsulating the interconnect device and the first through via in a first molding compound.

3. The method of claim 2, further comprising thinning the interconnect device after the encapsulating the interconnect device and the first through via in the first molding compound.

4. The method of claim 2, wherein the encapsulating the interconnect device and the first through via in the first molding compound comprises a lamination process.

5. The method of claim 2, further comprising encapsulating the second through via and the third through via in a second molding compound.

6. The method of claim 5, wherein the encapsulating the second through via and the third through via in the second molding compound comprises a lamination process.

7. The method of claim 1, further comprising forming a second metallization layer over both the first top surface and the second top surface, wherein the second metallization layer is in electrical connection with both the second through via and the third through via.

8. A semiconductor device comprising:
a local interconnect device embedded in a first encapsulant wherein the local interconnect device comprises a first conductive via and a semiconductor substrate, the first conductive via extending through the semiconductor substrate;
a second conductive via embedded in the first encapsulant adjacent to the local interconnect device;
a first redistribution layer over the local interconnect device and the second conductive via and electrically coupled to the first conductive via and the second conductive via;
a second encapsulant over the first redistribution layer;
a third conductive via embedded in the second encapsulant directly over the local interconnect device and electrically coupled to the first redistribution layer, wherein the third conductive via has a first width; and
a fourth conductive via embedded in the second encapsulant directly over the second conductive via and electrically coupled to the first redistribution layer, wherein the fourth conductive via has a second width, the second width being at least 15 µm wider than the first width.

9. The device of claim 8, further comprising a first external connector electrically coupled to the local interconnect device by a second redistribution layer.

10. The device of claim 9, further comprising a second external connector electrically coupled to the local interconnect device by the third conductive via.

11. The device of claim 9, further comprising a packaged device die-to-die bonded to the first external connector.

12. The device of claim 8, wherein the first redistribution layer comprises a third encapsulant, the third encapsulant being different from the first encapsulant.

13. The device of claim 8, wherein a top surface of the first conductive via and a top surface of the second conductive via are coplanar with a top surface of the first encapsulant.

14. The device of claim 13, wherein a bottom surface of the second conductive via is further away from the top surface of the first encapsulant than a bottom surface of the first conductive via.

15. A semiconductor device comprising:
a first conductive via over a first metallization layer, the first conductive via having a first bottom surface facing towards the first metallization layer;
a local interconnect device bonded to the first metallization layer adjacent to the first conductive via, wherein the local interconnect device comprises a redistribution layer with a pitch of less than about 0.6 µm, and wherein the local interconnect device comprises a through via of the local interconnect device, wherein the through via of the local interconnect device extends through a local interconnect substrate, the through via having a second bottom surface facing towards the first metallization layer, the first bottom surface being closer to the first metallization layer than the second bottom surface;
a first molding compound encapsulating the local interconnect device;
a back-side redistribution layer over the local interconnect device and the first molding compound, the back-side redistribution layer in physical contact with the through via of the local interconnect device;
a second conductive via over the back-side redistribution layer; and
a second molding compound encapsulating the second conductive via and the back-side redistribution layer.

16. The device of claim 15, wherein the back-side redistribution layer further comprises:
a via;
a dielectric material encapsulating the via; and
a conductive line in physical contact with both the via and the dielectric material.

17. The device of claim 15, further comprising a third conductive via on the first metallization layer, the third conductive via encapsulated by the first molding compound.

18. The device of claim 15, further comprising a first external connector over the second conductive via and an interposer structure bonded to the first external connector.

19. The device of claim 18, further comprising a second external connector over the first metallization layer and a packaged device bonded to the second external connector.

20. The device of claim 15, wherein the first bottom surface is in direct physical contact with the first metallization layer.

* * * * *